(12) United States Patent
Schiltz

(10) Patent No.: US 6,653,054 B2
(45) Date of Patent: Nov. 25, 2003

(54) RESIN, A DOUBLE RESIN LAYER FOR EXTREME ULTRAVIOLET LIGHT (EUV) PHOTOLITHOGRAPHY, AND AN EXTREME ULTRAVIOLET LIGHT (EUV) PHOTOLITHOGRAPHY PROCESS

(75) Inventor: André Schiltz, Saint Ismier (FR)

(73) Assignee: France Télécom, Paris (FR)

( * ) Notice: Subject to any disclaimer, the term of this patent is extended or adjusted under 35 U.S.C. 154(b) by 0 days.

(21) Appl. No.: 09/912,057

(22) Filed: Jul. 25, 2001

(65) Prior Publication Data
US 2002/0072014 A1 Jun. 13, 2002

(30) Foreign Application Priority Data
Jul. 26, 2000 (FR) .............................. 00 09759

(51) Int. Cl.[7] .............................. G03F 7/00; G03F 7/16; C08J 7/18
(52) U.S. Cl. .............................. 430/312; 430/9; 430/14; 430/15; 430/311; 430/313; 430/322; 430/323; 430/394; 427/489
(58) Field of Search ................. 430/311, 312, 430/313, 322, 323, 9, 14, 15, 397, 966; 427/489

(56) References Cited
U.S. PATENT DOCUMENTS

| | | | | |
|---|---|---|---|---|
| 4,394,437 A | * | 7/1983 | Bergendahl et al. | 430/312 |
| 5,487,967 A | * | 1/1996 | Hutton et al. | 430/322 |
| 6,007,963 A | * | 12/1999 | Felter et al. | 430/271.1 |
| 6,150,256 A | * | 11/2000 | Furukawa et al. | 438/618 |
| 6,451,512 B1 | * | 9/2002 | Rangarajan et al. | 430/313 |
| 2001/0004510 A1 | * | 6/2001 | Wheeler | 430/270.1 |
| 2002/0072014 A1 | * | 6/2002 | Schiltz | 430/312 |

FOREIGN PATENT DOCUMENTS

| | | | | |
|---|---|---|---|---|
| EP | 113 034 | * | 7/1984 | G03F/7/10 |
| EP | 0 197 519 A2 | * | 10/1986 | G03F/7/02 |
| EP | 0940 719 A2 | * | 9/1999 | G03F/7/095 |
| JP | 1-302350 | * | 12/1989 | G03C/5/00 |
| JP | 4-206966 | * | 7/1992 | H01L/27/14 |
| JP | 8-306604 | * | 11/1996 | H01L/21/027 |

* cited by examiner

Primary Examiner—Mark F. Huff
Assistant Examiner—Nicole Barreca
(74) Attorney, Agent, or Firm—Meyertons, Hood, Kivlin, Kowert & Goetzel, P.C.; Eric B. Meyertons

(57) ABSTRACT

A semiconductor substrate etching masking layer onto which the pattern to be etched can be transferred by photolithography at extreme ultraviolet light wavelengths from 10 to 100 nm and which is resistant to plasma etching. An ultraviolet light semiconductor integrated circuit photolithography process and the use for fabricating a double masking layer for semiconductor substrate etching of a photo-ablation layer sensitive to extreme ultraviolet light and resistant to deep ultraviolet light and/or ultraviolet light coupled to a polymer resin layer resistant to extreme ultraviolet light and to plasma etching when the resin has been developed and sensitive to deep ultraviolet light and/or to ultraviolet light.

16 Claims, 2 Drawing Sheets

RESIN, A DOUBLE RESIN LAYER FOR EXTREME ULTRAVIOLET LIGHT (EUV) PHOTOLITHOGRAPHY, AND AN EXTREME ULTRAVIOLET LIGHT (EUV) PHOTOLITHOGRAPHY PROCESS

BACKGROUND OF THE INVENTION

1. Field of the Invention

The present invention relates to photolithography techniques and aims to provide resins sensitive to extreme ultraviolet light (EUV) wavelengths for making masks resisting plasma etching and enabling structures with dimensions of less than 0.1 μm to be obtained.

2. Description of the Related Art

The expression "extreme ultraviolet light" generally refers to light at wavelengths less than 100 nm and in particular at wavelengths of around 11 to 13 nm.

Light in the range of wavelengths from 300 to 100 nm is generally referred to as deep ultraviolet light. The expression "ultraviolet light" refers to light at wavelengths from 700 to 300 nm.

The wavelengths routinely used in photolithography are in the deep ultraviolet (DUV) range, are generally of the order of 193 to 248 nm, and enable structures with critical dimensions from 0.18 μm to 0.12 μm to be obtained.

At these wavelengths some resins already exhibit photo-ablation, given that the radiation energy is of the order of 6.4 eV at a wavelength of 193 nm. At a wavelength of 13 nm, which corresponds to an energy of 92.5 eV, photo-ablation or partial sublimation by depolymerization should be observed in many photolithography mask resins.

These observations have led to the development of various compositions of the materials of photolithography masks since it is no longer necessary to add photosensitive substances or acid generators to make them sensitive, the materials being quasi-inherently sensitive to wavelengths from 11 to 13 nm.

Modern photolithography techniques use a 193 nm (DUV) ArF excimer laser and enable the fabrication of structures with critical dimensions of the order of 0.1 μm using phase-shift masks (PSM).

Problems with the transparency of the masks already begin to appear at this wavelength, and at shorter wavelengths other limitations are operative, for example excessive absorption of conventional chemical amplification resins, absence of transparency of the silica at wavelengths of less than 160 nm, which imply the use of $CaF_2$, and the necessity to operate in a flow of nitrogen or in a vacuum at wavelengths from 172 nm.

For the above reasons, and to push back the limitations of deep UV lithography without having recourse to PSM techniques, many experiments have been conducted using extreme ultraviolet light wavelengths of around 11 nm to 13 nm, and research has also been conducted into X-ray beam lithography, electron beam lithography and ion beam lithography.

One of the main problems arising from the use of lithography techniques below 193 nm lies mainly in the design of the lithography tool. In particular, the problem of absorption of light in the optics is often encountered, and the only solution is to use reflective optics (mirrors and mask), rather than refractive optics, and what is more in a vacuum. "Photorepeaters" (die by die image repetition equipment) operating by reflection have already been used at a wavelength of 13.4 nm, for example. Also, initial experiments indicate that multilayers of silicon and molybdenum offer reflection ratios of the order of 70% at a target EUV wavelength of 13 nm (92.5 eV). These multilayers have low absorption and refractive indices respectively greater than and less than 1 in the range from 70 to 100 eV that corresponds to wavelengths from 18 to 12 nm. These masks are made by depositing palladium on multilayers of silicon and molybdenum.

As a general rule, the sources used to produce EUV radiation are either a synchrotron or a plasma generated by firing a pulsed laser onto a metallic (Cu, Au and Sn) target or using xenon "cluster" gas jets.

With regard to photosensitive resins, given the generally high absorption of the polymers used at short wavelengths, it can be assumed that the sensitivity of photosensitive resins in the EUV will be high, but the depth of penetration very small, which is why the use of top surface imaging (TSI) techniques is generally recommended, such as the silylation technique that consists of diffusing a reactive gas based on disilane, the use of double layers consisting of organosilicon resin and planarizing resin, or the use of very thin sensitive layers or photo-ablation layers.

As just explained, given the high absorption of the prior art resins at short wavelengths, the sensitivity of polymers to EUV radiation is generally high, but the depth of penetration could prove to be too small to authorize the use of resin layers sufficiently thick to act as an etching mask, regardless of the technique employed.

In particular, for top surface imaging resins using the silylation technique that involves diffusing a reactive gas based on disilane in the exposed areas, the main limitations concern the non-uniformity of silylation, both locally and globally, due to diffusion of the gas and to swelling of the exposed parts, and an increased sensitivity of the resin to many parameters, such as the working pressure or the wavelength used.

Top surface imaging resins using the double layer technique with organosilicon resin and planarizing resin appear to be more beneficial than silylation techniques. This is because organosilicon resins have great potential because they can consist of molecules that are either richer in carbon or richer in silica which, after EUV exposure, adopt a positive or negative behavior on development. This positive or negative behavior is obtained by developing the exposed parts which are richer in silica in an acid or basic solution or by developing the unexposed parts in a solvent. Experiments have been conducted at 193 nm on polysiloxanes and polysilazanes to fabricate 0.1 to 0.2 nm structures and have shown a satisfactory sensitivity from 30 to 100 mJ/cm$^2$ at 193 nm. At 13.4 nm the energy is much higher (92.5 eV) and even leads to excitation of the Si 2p and Si 2s electrons. It has nevertheless become apparent that absorption is still the limiting factor.

Although promising, this approach remains a top surface imaging technique, given the absorption of light at the surface of the layers, and gives rise to associated problems with lateral diffusion and resistance of the patterns.

Another approach previously mentioned consists in investigating very thin single layers of resin given the high absorption of EUV in resins such as polysiloxane resins, such as those already mentioned above, or methacrylic esters.

Recent experiments have used resins based on HEMA (hydroxyethyl methacrylate) methacrylic esters without chemical amplification and show acceptable sensitivity at 193 nm to electron beams and to X-ray beams.

However, these resins are necessarily very thin and do not constitute a sufficiently resistant mask.

With regard to the use of photo-ablation layers, resins exhibiting this behavior have been tried at 193 nm with relative success, given the low exposure energy (6.4 eV).

At a wavelength of 13 nm the energy is much higher (92.5 eV) and enables easier photo-ablation of some polymers or sublimation by depolymerization of intrinsically unstable polymers.

Experiments have been conducted with intrinsically unstable polyphthalaldehyde polymers, synthesized below its floor temperature, i.e. at a temperature below which the equilibrium of the polymerization and depolymerization reactions would be shifted toward depolymerization, and stabilized by grafting a stable molecule to the end of the chain.

The main problem encountered when using single photo-ablation layers is that they are not resistant to plasma etching precisely because of their capacity for photo-ablation and do not constitute functional masking layers.

The object of the invention is therefore to palliate the problems encountered in the prior art and to enable the execution of photolithography using extreme ultraviolet light radiation.

SUMMARY OF THE INVENTION

In accordance with one aspect of the invention the prior art problems are solved by providing a semiconductor substrate etching masking layer to which a pattern to be etched can be transferred by photolithography at extreme ultraviolet light wavelengths from 10 to 100 nm and which is resistant to plasma etching.

According to another aspect of the invention the semiconductor substrate etching masking layer includes a double layer structure comprising an upper layer of a material sensitive to extreme ultraviolet light wavelengths from 10 to 100 nm and resistant to deep ultraviolet light wavelengths from 300 to 100 nm and/or to ultraviolet light wavelengths from 700 to 300 nm, and a lower layer of a material resistant to extreme ultraviolet light wavelengths from 10 to 100 nm, resistant to plasma etching when said resin has been developed, and sensitive to deep ultraviolet light wavelengths from 300 to 100 nm and/or ultraviolet light wavelengths from 700 to 300 nm.

Accordingly, in one particular embodiment of the mask according to the invention, the top layer is a resin that is not resistant to extreme ultraviolet light radiation, into which the image of the lithography mask is transferred by a physical process referred to as photo-ablation, and that does not necessitate any development step, and the lower layer is a resin resistant to extreme ultraviolet light that serves as a masking layer resistant to plasma etching when said resin has been developed.

The upper layer defined in this way serves as a self-supporting mask during image transfer into the lower layer by full-wafer exposure.

One advantage of a combination of materials defining the double layer structure in accordance with the invention is that it necessitates an EUV photolithography and full-wafer DUV exposure step but requires only one development step in the usual liquid phase or in the dry phase using a plasma.

In particular, this kind of combination of an upper photo-ablation layer and a lower layer that can be developed dry saves a spreading track and guarantees optimum definition of lithography patterns below 0.1 $\mu$m.

The upper layer of the double layer combination according to the invention preferably has the following properties:
  it is not necessarily resistant to plasma etching,
  it is sensitive to EUV and is decomposed by photo-ablation, and therefore does not necessitate any additional development step, and
  it is resistant to DUV and UV, thereby enabling the definition of patterns by full-wafer exposure in the lower layer resistant to extreme ultraviolet light.

In particular, in one embodiment of the invention, the preferred material for the upper layer of the double layer combination according to the invention is a resin based on nitrocellulose and/or a resin based on polyphthalaldehyde.

The lower layer of the double layer combination according to the invention preferably has the following properties:
  after development, it must resist plasma etching of the layer to be etched and in particular, for etching poly-crystalline silicon gates, it must resist chlorinated, brominated and fluorinated plasmas, and
  it is sensitive to DUV and/or UV, and thereby enables the definition of patterns by full-wafer exposure.

In particular, in one embodiment of the invention, the lower layer includes a material able to be converted into pseudo-silica.

In one particular embodiment of a double layer structure according to the invention, the material contained in said lower layer is converted into pseudo-silica by treatment with an oxygen-based plasma.

In particular, said lower layer includes an organosilicon material.

Said organosilicon material is preferably chosen from polysiloxanes and/or polysilazanes.

Said organosilicon material is preferably chosen from polyphenylmethylsilsesquioxane and perhydrosilazane.

In one particular embodiment of the masking layers according to the invention, said lower layer is obtained by deposition from a polymethylsilane plasma.

The invention also relates to the use, for fabricating a double masking layer for semiconductor substrate etching, of a photo-ablation layer sensitive to extreme ultraviolet light wavelengths from 10 to 100 nm and resistant to deep ultraviolet light wavelengths from 300 to 100 nm and/or to ultraviolet light wavelengths from 700 to 300 nm, coupled to a layer of polymer resin resistant to extreme ultraviolet light wavelengths from 10 to 100 nm and to plasma etching when said resin has been developed, and sensitive to deep ultraviolet light wavelengths from 300 to 100 nm and/or to ultraviolet light wavelengths from 700 to 300 nm.

Using a photolithography mask in accordance with the invention produces patterns with dimensions less than 0.1 $\mu$m. The image of the lithography mask is formed directly in the upper layer by a physical photo-ablation process without shrinkage because the conventional diffusion and dissolution effects of wet development are eliminated.

In one particular use, a photo-ablation layer is chosen comprising a resin based on nitrocellulose and/or a resin based on polyphthalaldehyde.

In accordance with another use, said polymer resin layer comprises a material that can be converted into pseudo-silica.

In particular, the conversion of the material comprised in said polymer layer into said pseudo-silica is obtained by means of treatment with an oxygen-based plasma.

In particular, said polymer resin layer comprises an organosilicon material.

Said organosilicon material is preferably chosen from polysiloxanes and polysilazanes.

Said organosilicon material is preferably chosen from polyphenylmethylsilsesquioxane and perhydrosilazane.

For one particular use in accordance with the invention, said polymer resin layer is obtained by deposition from a polymethylsilane plasma.

The invention also relates to a photolithography process using a mask in accordance with the invention and in particular an ultraviolet light semiconductor integrated circuit photolithography process comprising a step of ultraviolet light exposure of a polymer resin layer covering a layer to be etched disposed on a support layer, a step of developing said polymer resin layer after exposure, and a step of etching said layer to be etched in accordance with the pattern of the mask thus formed in which there is exposed, at extreme ultraviolet light wavelengths from 10 to 100 nm, a first polymer resin layer resistant to deep ultraviolet light wavelengths from 300 to 100 nm and/or to ultraviolet light wavelengths from 700 to 300 nm and then there is exposed, at deep ultraviolet light wavelengths from 300 to 100 nm, a second polymer resin layer resistant to extreme ultraviolet light wavelengths from 10 to 100 nm and resistant to plasma etching after said resin has been developed, before developing the pattern of the mask thus exposed and etching said layer to be etched.

In particular, in one embodiment of the invention, a first polymer resin layer is chosen comprising a resin based on nitrocellulose and/or a resin based on polyphthalaldehyde.

In particular, in one embodiment of the invention, said second polymer resin layer comprises a material that can be converted into pseudo-silica.

In one particular embodiment of a double layer structure according to the invention, the material comprised in said second polymer layer is converted into pseudo-silica by treatment with an oxygen-based plasma.

In particular, said second polymer resin layer comprises an organosilicon material.

Said organosilicon material is preferably chosen from polysiloxanes and/or polysilazanes.

Said organosilicon material is preferably chosen from polyphenylmethylsilsesquioxane and perhydrosilazane.

In one particular embodiment of the process according to the invention, said second polymer resin layer is obtained by deposition from a polymethylsilane plasma.

Other advantages of the invention will become apparent on reading the remainder of the description, describing figuratively and non-limitingly one embodiment of a process in accordance with the invention using a double layer etching mask in accordance with the invention.

DETAILED DESCRIPTION OF THE PREFERRED EMBODIMENT

Figure 1:
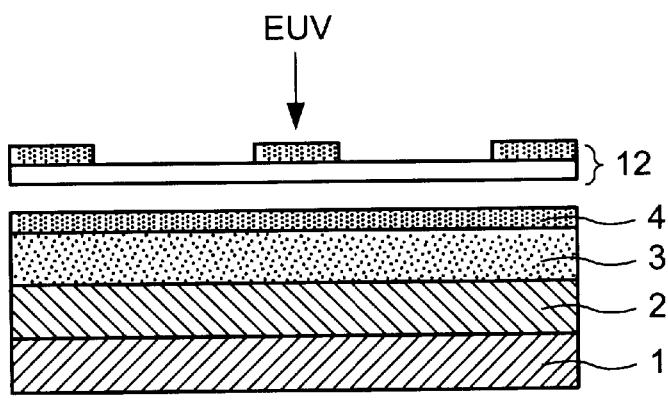
FIGS. 1 to 7 are views in section of a device comprising a masking layer in accordance with the invention at various stages in the execution of the process in accordance with the invention.

FIG. 1 shows a combination comprising a support layer 1 on one surface of which rests a layer 2 of a substrate to be etched. On this combination is disposed a first layer 3 of a polymer resin that is resistant to extreme ultraviolet light wavelengths from 10 to 100 nm, that is resistant to plasma etching when said resin has been developed, and that is sensitive to deep ultraviolet light wavelengths from 300 to 100 nm. Finally, a second layer 4 of polymer resin that is resistant to deep ultraviolet light wavelengths from 300 to 100 nm and/or to ultraviolet light wavelengths from 700 to 300 nm and that is sensitive to extreme ultraviolet light wavelengths from 10 to 100 nm completes the starting combination. A mask 12 carrying the pattern to be etched on the layer 2 is then used.

Ideally, the material of the support 1 contains silicon, for example pure monocrystalline or polycrystalline silicon, or any other material commonly used in the fabrication of integrated circuits.

With regard to the layer 2 of the substrate that is to be etched, a material containing silicon is also chosen, preferably a material of different composition to the support 1, for example a silicon/germanium alloy of the type $Si_{1-x}Ge_x$ ($0<x<1$) or of the type $Si_{1-x-y}Ge_xC_y$ ($0<x<0.95$ and $0<y<0.95$) that can be selectively eliminated relative to the material of the support 1, for example, by means of a wet oxidizing chemical process, for example with a solution comprising 40 ml of 70% $HNO_3$+20 ml of $H_2O_2$+5 ml of 0.5% HF, or by means of isotropic plasma etching.

The second layer 4 is ideally chosen from materials comprising a resin based on nitrocellulose and/or a resin based on polyphthalaldehyde. These materials can be photo-ablated at EUV wavelengths but have a resistance of the order of 2 000 to 3 000 $mJ/cm^2$ at 193 nm. For example, a resin based on nitrocellulose has an EUV sensitivity of 140 $mJ/cm^2$ and a sensitivity of 3 000 $mJ/cm^2$ at 193 nm. It does not matter whether these materials are resistant to plasma etching or not.

The first layer 3 ideally comprises a material that can be converted into pseudo-silica, for example by treatment with an oxygen-based plasma. In particular, this material can be an organosilicon material, preferably chosen from polysiloxanes and/or polysilazanes.

The organosilicon material of the first layer 3 can equally be chosen from perhydrosilazane and polyphenylmethylsilsesquioxane or obtained by deposition from a polymethylsilane plasma. These materials have a sensitivity less than 100 $mJ/cm^2$ at 193 nm. For example, polyphenylmethylsilsesquioxane and perhydrosilazane have respective sensitivities of 100 and 40 $mJ/cm^2$ at 193 nm.

The materials of the first layer 3 are nevertheless chosen so that they are resistant to plasma etching when said resin has been developed at deep ultraviolet light wavelengths from 300 to 100 nm.

The above combination is then exposed to extreme ultraviolet light, for example at 13.4 nm. The second layer is then subjected to photo-ablation in the areas not protected by the mask 5.

Figure 2:
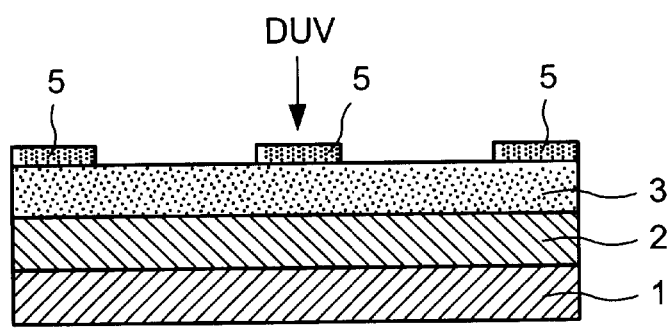

The combination shown in FIG. 2 is then obtained, this figure showing residual islets 5 of the layer 4 surrounded by empty areas resulting from photo-ablation of the layer 4.

The combination is then exposed to deep ultraviolet light, for example at 193 nm.

Figure 3:
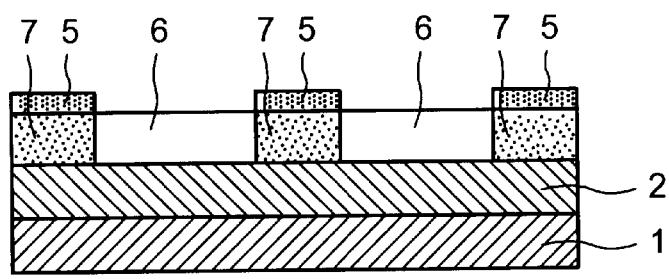

The combination shown in FIG. 3 is then obtained, which figure shows, under the residual islets 5 of the layer 4 surrounded by empty areas caused by photo-ablation of the layer 4, residual islets 7 of the layer 3 that have not been attacked by the deep ultraviolet light and unprotected areas 6 that have been attacked by the deep ultraviolet light.

Figure 4:
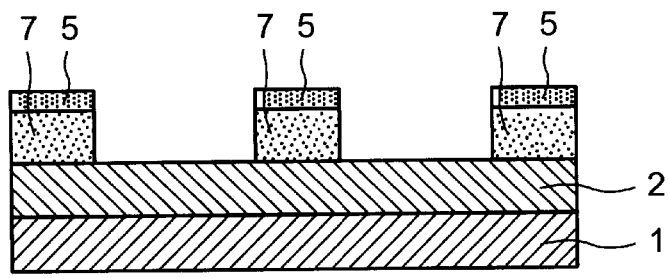
Figure 5:
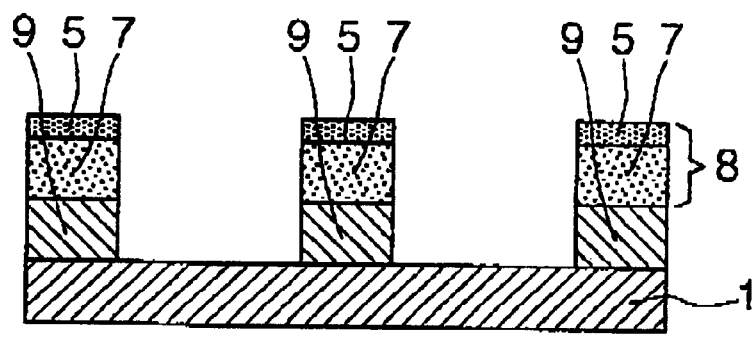
Figure 6:
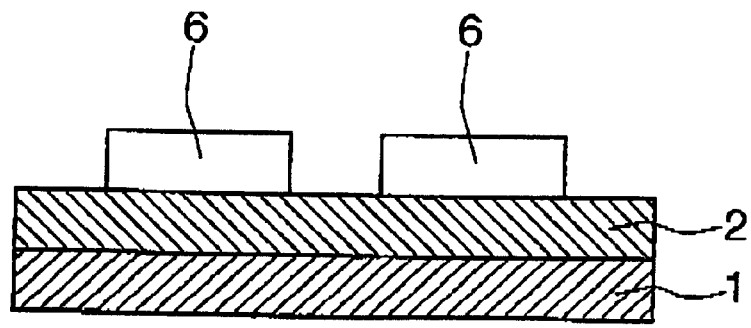
Figure 7:
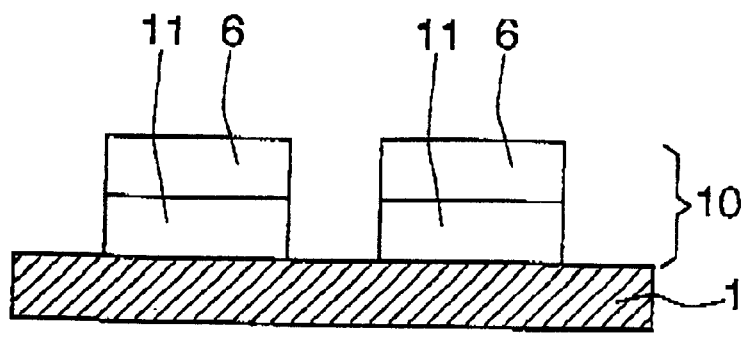

At this stage, there are two possible approaches to development, namely a positive mode, shown in FIGS. 4 to 5, and a negative mode, shown in FIGS. 6 to 7.

In the positive first development mode the combination as shown in FIG. 3 is subjected to wet development to eliminate the areas 6 irradiated by the deep ultraviolet light.

The combination shown in FIG. 4 is then obtained, which has a support layer 1 on one surface of which rests a layer 2 of a substrate to be etched. On the layer 2 rest stacks 8 made up of residual islets 7 of the layer 3 resistant to plasma etching and residual islets 5 of the layer 4.

The combination obtained in this way is then etched to eliminate the exposed parts of the layer 2 not protected by the stacks 8.

The combination shown in FIG. 5 is then obtained, which includes residual islets 9 of the layer 2 that correspond to the areas not protected by the stacks 8 and represent the pattern of the mask 5 from FIG. 1. The presence of the residual islets 5 is dependent on the resistance of the material used to make the first polymer resin layer 3.

In the negative second development mode the combination shown in FIG. 3 is subjected to dry development, for example using an oxygen-based plasma.

The combination shown in FIG. 6 is then obtained, which includes areas 6 that have been subjected to the deep ultraviolet light and are resistant to plasma etching resting on a layer 2 of a substrate to be etched in turn resting on a surface of a support layer 1. The areas 6 are present because they are resistant to the oxygen-based plasma when the layer 3 has been exposed. In this embodiment, a material is preferably chosen for the layers 3 and 4 that has no intrinsic resistance to an oxygen-based plasma.

The combination produced in this way is then etched to eliminate the exposed parts of the layer 2 not protected by the areas 6 of the layer 3, in the same way as for positive development.

The combination shown in FIG. 7 is then obtained, which has stacks 10 consisting of the areas 6 of the layer 3 and the residual islets 11 of the layer 2 protected by the areas 6 of the layer 3. The negative of the pattern of the mask 5 from FIG. 1 is then obtained.

I claimed:

1. A semiconductor substrate etching masking layer comprising an upper layer and a lower layer, wherein the upper layer comprises a material sensitive to wavelengths of light less than 100 nm and at least 10 nm, and wherein the upper layer material is resistant to wavelengths of light from 300 to 100 nm and/or wavelengths of light from 700 nm to 300 nm, and wherein the lower layer comprises a material resistant to wavelengths of light less than 100 nm and greater than 10 nm, and wherein the lower layer material is sensitive to wavelengths of light from 300 to 100 nm and/or wavelengths of light from 700 nm to 300 nm, and wherein the lower layer material is resistant to plasma etching when the lower layer has developed.

2. The masking layer claimed in claim 1 wherein said upper layer comprises a material selected from the group consisting of resins based on nitrocellulose, resins based on polyphthalaldehyde and mixtures thereof.

3. The masking layer claimed in claim 1 wherein said lower layer comprises a material that can be converted into pseudo-silica.

4. The masking layer claimed in claim 3 wherein said lower layer is convertible by treatment with an oxygen-based plasma.

5. The masking layer claimed in claim 1 wherein said lower layer comprises an organosilicon material.

6. The masking layer claimed in claim 5 wherein said organosilicon material is selected from the group consisting of polysiloxanes, polysilazanes and mixtures thereof.

7. The masking layer claimed in claim 6 wherein said organosilicon material is selected from the group consisting of polyphenylmethylsilsesquioxane and perhydrosilazane.

8. The masking layer claimed in claim 1 wherein said lower layer is deposited from a polymethylsilane plasma.

9. A process for fabricating a double masking layer for semiconductor substrate etching comprising coupling a photo-ablation layer sensitive to extreme ultraviolet light wavelengths less than 100 nm and at least 10 nm and resistant to deep ultraviolet light wavelengths from 300 to 100 nm and/or to ultraviolet light wavelengths from 700 to 300 nm to a second polymer resin layer resistant to extreme ultraviolet light wavelengths less than 100 nm and at least 10 nm, resistant to plasma etching when said second polymer resin layer has been developed and sensitive to deep ultraviolet light wavelengths from 300 to 100 nm and/or to ultraviolet light wavelengths from 700 to 300 nm.

10. The process claimed in claim 9 wherein said photo-ablation layer comprises a material selected from the group consisting of resins based on nitrocellulose, resins based on polyphthalaldehyde and mixtures thereof.

11. The process claimed in claim 9 wherein said second polymer resin layer comprises a material that can be converted into pseudo-silica.

12. The process claimed in claim 11 wherein said second polymer resin layer is convertible by treatment with an oxygen-based plasma.

13. The process claimed in claim 9 wherein said second polymer resin layer comprises an organosilicon material.

14. The process claimed in claim 13 wherein said organosilicon material is selected from the group consisting of polysiloxanes, polysilazanes and mixtures thereof.

15. The process claimed in claim 14 wherein said organosilicon material is selected from the group consisting of polyphenylmethylsilsesquioxane and perhydrosilazane.

16. The process claimed in claim 9 wherein said second polymer resin layer is deposited from a polymethylsilane plasma.

* * * * *

UNITED STATES PATENT AND TRADEMARK OFFICE
CERTIFICATE OF CORRECTION

PATENT NO. : 6,653,054 B2
DATED : November 25, 2003
INVENTOR(S) : Andre Schiltz

It is certified that error appears in the above-identified patent and that said Letters Patent is hereby corrected as shown below:

<u>Title page,</u>
Item [75], Inventor, please delete "Saint Ismier" and substitute therefor -- "Bernin" --.

<u>Column 7,</u>
Line 37, please delete "1 claimed" and substitute therefor -- I claim --.

<u>Column 8,</u>
Line 48, please delete "polyphenylmethylsilsesquoxane" and substitute therefor
-- polyphenylmethylsilsesquioxane --.

Signed and Sealed this

Eighth Day of June, 2004

JON W. DUDAS
*Acting Director of the United States Patent and Trademark Office*